United States Patent
Li et al.

(10) Patent No.: US 11,112,663 B2
(45) Date of Patent: Sep. 7, 2021

(54) ARRAY SUBSTRATE AND MANUFACTURING METHOD THEREOF, AND ELECTRONIC DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xiaoji Li, Beijing (CN); Yanli Zhao, Beijing (CN); Zhe Li, Beijing (CN); Peng Li, Beijing (CN); Haoxiang Fan, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 45 days.

(21) Appl. No.: 16/636,490

(22) PCT Filed: Jan. 4, 2019

(86) PCT No.: PCT/CN2019/070501
§ 371 (c)(1),
(2) Date: Feb. 4, 2020

(87) PCT Pub. No.: WO2020/140294
PCT Pub. Date: Jul. 9, 2020

(65) Prior Publication Data
US 2021/0063829 A1    Mar. 4, 2021

(51) Int. Cl.
*G02F 1/1343* (2006.01)
*G02F 1/1333* (2006.01)
(Continued)

(52) U.S. Cl.
CPC ...... *G02F 1/136227* (2013.01); *G02F 1/1337* (2013.01); *G02F 1/1368* (2013.01);
(Continued)

(58) Field of Classification Search
CPC ............... H01L 27/124; H01L 27/1248; H01L 27/1259; H01L 27/3248; H01L 27/3276;
(Continued)

(56) References Cited

U.S. PATENT DOCUMENTS 9,329,447 B2 * 5/2016 Jung .................... G02B 6/0083
10,410,884 B2   9/2019 Mitarai et al.

FOREIGN PATENT DOCUMENTS

CN          104299916 A      1/2015

* cited by examiner

*Primary Examiner* — Thoi V Duong
(74) *Attorney, Agent, or Firm* — Dilworth & Barrese, LLP.; Michael J. Musella, Esq.

(57) ABSTRACT

An array substrate, a manufacturing method thereof, and an electronic device are provided. The array substrate includes: a base substrate having a first side, a second side opposite to the first side and a via hole passing through a plate body of the base substrate; a switch element at the first side of the base substrate; and a pixel electrode which is at the second side of the base substrate and which is electrically connected with the switch element through the via hole.

20 Claims, 16 Drawing Sheets

(51) Int. Cl.
  *G02F 1/1368* (2006.01)
  *G02F 1/1362* (2006.01)
  *G02F 1/1337* (2006.01)
  *H01L 27/12* (2006.01)

(52) U.S. Cl.
  CPC .... *G02F 1/13439* (2013.01); *G02F 1/133345* (2013.01); *G02F 1/134309* (2013.01); *G02F 1/136286* (2013.01); *H01L 27/124* (2013.01); *H01L 27/1218* (2013.01); *H01L 27/1248* (2013.01); *H01L 27/1259* (2013.01); *G02F 1/134345* (2021.01); *G02F 1/136222* (2021.01); *G02F 2201/121* (2013.01); *G02F 2201/40* (2013.01)

(58) Field of Classification Search
  CPC ........... H01L 27/1218; G02F 1/136227; G02F 1/1368; G02F 1/133345; G02F 1/136286; G02F 1/134363; G02F 1/136222; G02F 1/134309; G02F 1/1362; G02F 1/133512; G02F 1/134345; G02F 1/13439; G02F 1/1337; G02F 1/133707; G02F 1/134318; G02F 1/1333; G02F 1/133302; G02F 1/133305; G02F 1/133357; G02F 1/133528; G02F 1/1343; G02F 2201/123; G02F 2201/40; G09G 3/36
  See application file for complete search history.

ARRAY SUBSTRATE AND MANUFACTURING METHOD THEREOF, AND ELECTRONIC DEVICE

TECHNICAL FIELD

The embodiments of the present disclosure relate to an array substrate and a manufacturing method thereof, and an electronic device including the array substrate.

BACKGROUND

In the field of display, liquid crystal displays are favored by engineers because of their good display effect and mature technology. The liquid crystal display includes an array substrate and an opposite substrate which are opposite to each other and includes a liquid crystal layer between the array substrate and the opposite substrate. When the liquid crystal display displays a dark picture, in order to avoid a phenomenon of light leakage in the dark picture to improve display contrast ratio, a method of increasing a width of a black matrix is generally adopted to avoid the light leakage. However, this reduces an aperture ratio of the display and increases a power consumption of the liquid crystal display.

SUMMARY

Embodiments of the present disclosure provide an array substrate, a manufacturing method thereof, and an electronic device including the array substrate, so as to reduce or eliminate light leakage during dark state display.

At least one embodiment of the present disclosure provides an array substrate including: a base substrate having a via hole passing through the base substrate in a thickness direction of the base substrate; a switch element at a first side of the base substrate; and a pixel electrode at a second side of the base substrate. The first side and the second side are opposite to each other in the thickness direction of the base substrate, and the pixel electrode is electrically connected with the switch element through the via hole.

For example, outside a position where the via hole is located, a surface which is provided with the switch element and which is included by the base substrate is flat at a position where the switch element is located.

For example, a thickness of the base substrate is larger than 50 microns.

For example, the base substrate includes a glass substrate, a plastic substrate or a quartz substrate.

For example, the switch element includes a gate electrode, and the gate electrode includes side walls which are respectively at opposite sides and which have opposite inclination directions; and a distance between the side walls gradually decreases in a direction from the second side to the first side.

For example, the switch element includes an active layer including a channel region, and an orthographic projection of the channel region on the base substrate overlaps an orthographic projection of the pixel electrode on the base substrate.

For example, the switch element includes a source electrode and a drain electrode, one of the source electrode and the drain electrode is electrically connected with the pixel electrode and includes a portion outside the via hole, and the portion is in direct contact with the base substrate.

For example, the pixel electrode is in direct contact with the base substrate.

For example, the array substrate further includes: a signal line which is at the first side of the base substrate and which is electrically connected with the switch element.

For example, the array substrate further includes: an alignment layer which is at the second side of the base substrate and which has an alignment direction along an extension direction of the signal line.

For example, an orthographic projection of the signal line on the base substrate overlaps an orthographic projection of the pixel electrode on the base substrate.

For example, the array substrate further includes: a passivation insulation layer which is at the second side of the base substrate and which directly covers the pixel electrode; and a common electrode which is at a side, away from the pixel electrode, of the passivation insulation layer and which is in direct contact with the passivation insulation layer. The alignment layer directly covers the common electrode.

For example, the array substrate further includes: a common electrode at the second side of the base substrate; the common electrode and the pixel electrode are in different layers.

For example, a layer where the pixel electrode is located is between a layer where the common electrode is located and the base substrate.

For example, the array substrate includes sub-pixel regions arranged in an array; the common electrode includes a plurality of common electrode strips arranged in sequence, and each common electrode strip is in a plurality of sub-pixel regions among the sub-pixel regions.

For example, the array substrate includes a display region and a non-display region outside the display region, the common electrode strip extends from a first boundary between the display region and the non-display region to a second boundary between the display region and the non-display region, the first boundary is opposite to the second boundary.

For example, the non-display region is provided with a common electrode signal line and a common electrode via hole which passes through the base substrate in the thickness direction of the base substrate, and the common electrode signal line is electrically connected with the common electrode through the common electrode via hole.

For example, the array substrate further includes: a color filter layer on the base substrate; the color filter layer and the switch element are at a same side of the base substrate.

At least one embodiment of the present disclosure further provides an array substrate including: a base substrate having a first side, a second side opposite to the first side, and a via hole passing through a plate body of the base substrate; a signal line at the first side of the base substrate; a switch element which is at the second side of the base substrate and which is electrically connected with the signal line through the via hole; and a pixel electrode which is at the second side of the base substrate and which is electrically connected with the switch element.

At least one embodiment of the present disclosure further provides an electronic device including the array substrates described in any one of the above embodiments.

For example, the electronic device further includes an opposite substrate opposite to the array substrate; the second side of the array substrate is a side, facing the opposite substrate, of the array substrate.

At least one embodiment of the present disclosure further provides a manufacturing method of an array substrate, the method includes: performing a hole-producing process on a base substrate so that the base substrate is formed with a via hole passing through a plate body of the base substrate;

forming a switch element at a first side of the base substrate; and forming a pixel electrode at a second side, opposite to the first side, of the base substrate, so that the pixel electrode is electrically connected with the switch element through the via hole.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

Figure 1A:
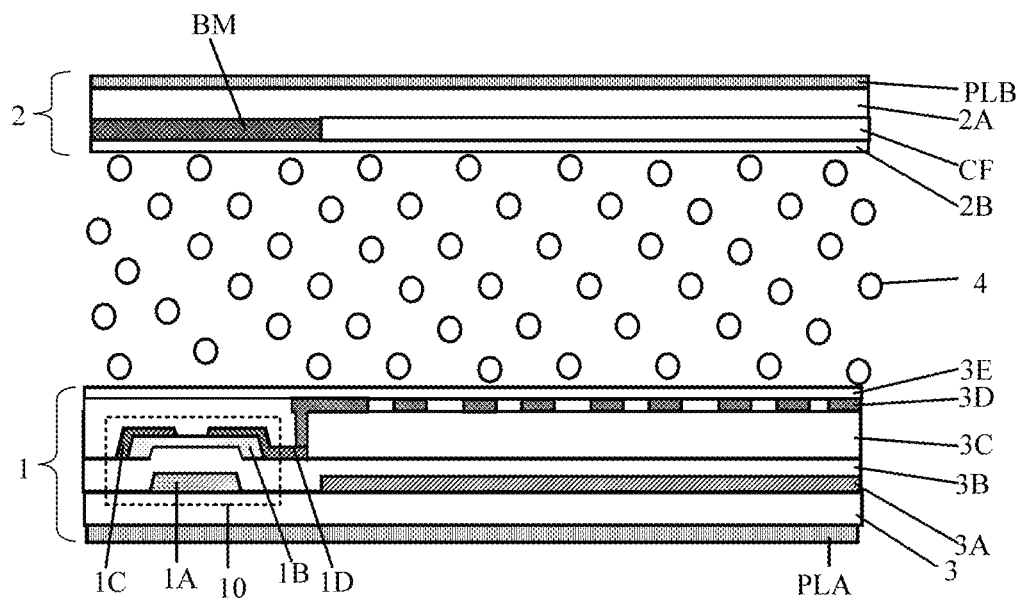
FIG. 1A is a schematic cross-sectional view of a liquid crystal display device.

FIG. 1A is a schematic cross-sectional view of a liquid crystal display device. As illustrated in FIG. 1A, the liquid crystal display device includes an array substrate 1 and an opposite substrate 2 which are opposite to each other and includes a liquid crystal layer 4 between the array substrate 1 and the opposite substrate 2. The array substrate 1 includes a base substrate 3 and a drive circuit structure located at a side of the base substrate 3 facing the liquid crystal layer 4. The drive circuit structure includes a transistor 10 including a gate 1A, an active layer 1B, a source electrode 1C, and a drain electrode 1D. The drive circuit structure of the array substrate 1 further includes a common electrode 3A, a gate insulation layer 3B, a passivation insulation layer 3C, a pixel electrode 3D and an alignment layer 3E, which are sequentially located at the side of the base substrate 3 facing the liquid crystal layer 4. The pixel electrode 3D is electrically connected with the transistor 10 through a via hole passing through the passivation insulation layer 3C. The array substrate 1 further includes a first polarizer PLA located at a side of the base substrate 3 away from the liquid crystal layer 4. The opposite substrate 2 includes a base substrate 2A and a second polarizer PLB located at a side of the base substrate 2A away from the liquid crystal layer 4, and includes a black matrix BM, a color filter layer CF and an alignment layer 2B which are located at a side of the base substrate 2A facing the liquid crystal layer 4. A polarization direction of the second polarizer PLB is, for example, perpendicular to a polarization direction of the first polarizer PLA, and for example, the color filter layer includes a red filter pattern, a green filter pattern, and a blue filter pattern. A thickness of the liquid crystal layer 4 is usually from 2.7 microns to 3.55 microns.

Figure 1B:
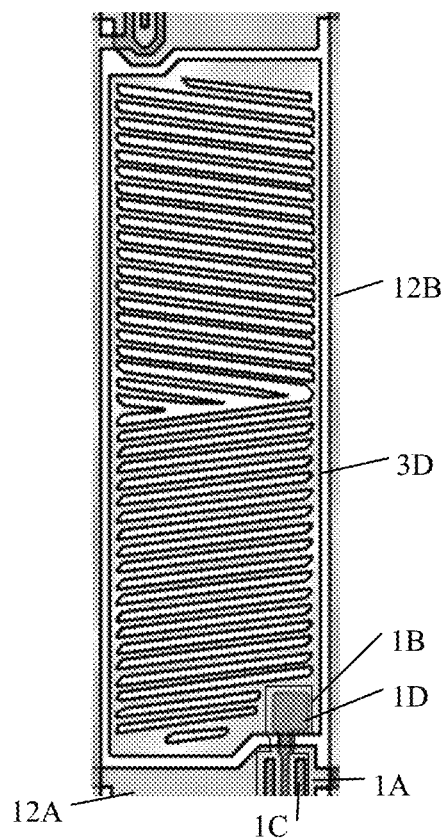
FIG. 1B is a schematic plan view of a sub-pixel region of the liquid crystal display device illustrated in FIG. 1A.

FIG. 1B is a schematic plan view of a sub-pixel region of the liquid crystal display device illustrated in FIG. 1A. As illustrated in FIG. 1B, the sub-pixel region is a region surrounded by two adjacent gate lines 12A of the array substrate and two adjacent data lines 12B of the array substrate, and a shape of the region is, for example, rectangular, parallelogram (non-rectangular) or the like.

Figure 1C:
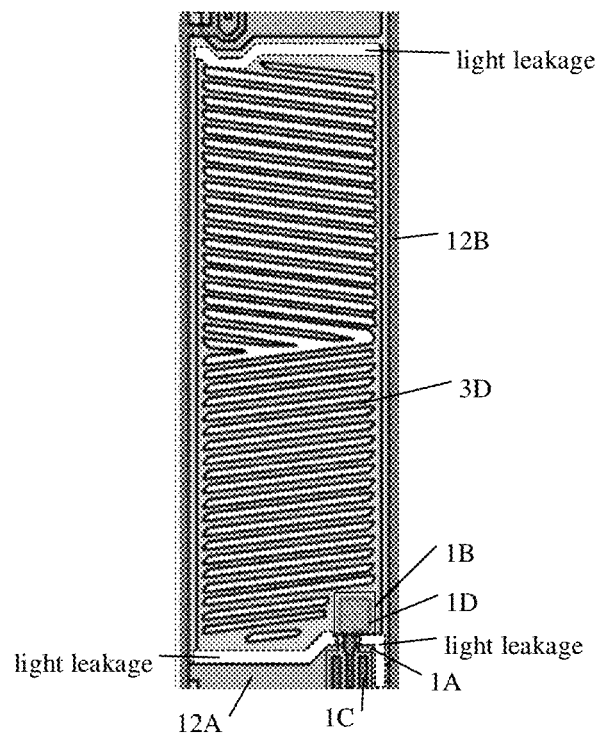
FIG. 1C is a schematic diagram of light leakage in the sub-pixel region illustrated in FIG. 1B.
Figure 1D:
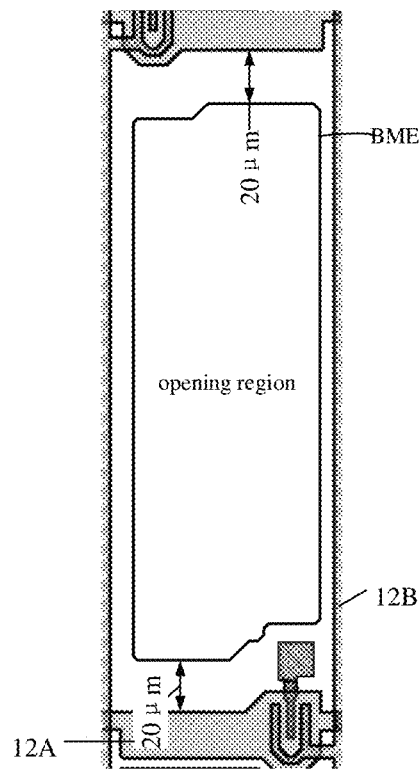
FIG. 1D is a schematic view of an opening region of the sub-pixel region illustrated in FIG. 1B.

FIG. 1C is a schematic diagram showing light leakage in the sub-pixel region illustrated in FIG. 1B; FIG. 1D is a schematic view of an opening region of the sub-pixel region illustrated in FIG. 1B. In a case where an alignment direction of the alignment layer 3E and an alignment direction of the alignment layer 2B are a horizontal direction, as illustrated in FIG. 1C, because of a voltage difference between the gate line 12A and the pixel electrode 3D/the common electrode 3A (not illustrated in FIG. 1C), liquid crystal molecules in the liquid crystal layer near the gate line 12A are deflected compared with liquid crystal molecules in the liquid crystal layer in the sub-pixel region during dark state display, so that the light leakage exists near the gate line 12A in the sub-pixel region. For example, as illustrated in FIG. 1D, a black matrix BM is provided outside the opening region, and a distance between an edge BME of the black matrix BM and the gate line 12A adjacent to the edge BME is larger and is, for example, 20 microns (μm), so that the black matrix BM has a larger width at a position of the gate line 12A so as to block the light leakage near the gate line 12A, but this reduces an aperture ratio of the sub-pixel region.

Some embodiments of the present disclosure provide an array substrate and a manufacturing method of the array substrate, and an electronic device including the array substrate. In the embodiments of the present disclosure, the array substrate includes a base substrate, and a switch element and a pixel electrode which are respectively positioned at opposite sides of the base substrate, and the switch element and the pixel electrode are electrically connected through a via hole passing through the base substrate. Because the base substrate separates the switch element and the pixel electrode, and a distance between the switch element and the pixel electrode is larger, a small electric field or even no electric field exits between the switch element and the pixel electrode when they are electrified, so that in a case where the array substrate of the embodiments of the present disclosure is used for a display device, a light leakage phenomenon of the display device during dark state display can be reduced or eliminated.

Figure 2:
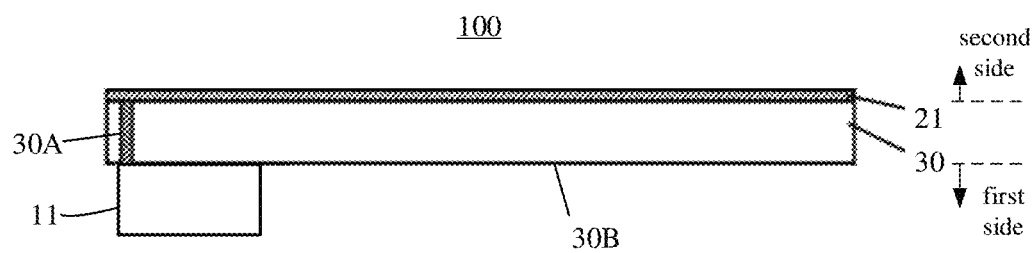
FIG. 2 to FIG. 4 are schematic cross-sectional views of an array substrate provided by some embodiments of the present disclosure.

As illustrated in FIG. 2, at least one embodiment of the present disclosure provides an array substrate 100 which includes a base substrate 30, a switch element 11 and a pixel electrode; the base substrate 30 has a first side, a second side opposite to the first side, and a via hole 30A passing through a plate body of the base substrate 30, the switch element 11 is at the first side of the base substrate 30, and the pixel electrode 21 is located at the second side of the base substrate 30 and electrically connected with the switch element 11 through the via hole 30A.

For example, the array substrate 100 is an array substrate used for a transmissive liquid crystal display device, and in this case, the base substrate 30 is a transparent substrate and the pixel electrode 21 is a transparent electrode. In other embodiments, the array substrate 100 may also be an array substrate used for other types of electronic devices.

For example, the base substrate 30 is a glass substrate, a plastic substrate, or a quartz substrate. For example, a material of the base substrate 30 is photosensitive glass, and the photosensitive glass is, for example, glass obtained by making $SiO_2$—$Li_2O$—$Al_2O_3$-based glass include a small amount of photosensitive metals Au, Ag and Cu and a small amount of photosensitizer $CeO_2$. Embodiments of that present disclosure include, but are not limited to this.

It should be noted that in some embodiments of the present disclosure, the base substrate 30 is a basic raw material for manufacturing the array substrate 100, that is, the base substrate 30 is a plate-shaped structure prepared in advance rather than a film formed on other plate-shaped structure in a process of manufacturing the array substrate 100. In addition, the via hole 30A provided in the base substrate 30 may be formed in the process of manufacturing the array substrate 100, or may be formed before the process of manufacturing the array substrate 100.

Because the base substrate 30 is a substrate prepared in advance rather than a film which covers the switch element 11 and which is formed in the process of manufacturing the array substrate 100, for example, in at least one embodiment, outside a position where the via hole 30A is located, a surface 30B which is included by the base substrate 30 and which is provided with the switch element 11 is flat at a position where the switch element 11 is located.

The inventors of the present application noticed in the research that in a case where a distance between the switch element 11 and the pixel electrode 21 is larger than 50 microns, there is basically no light leakage phenomenon in the sub-pixel region in the array substrate 100. Therefore, for example, in at least one embodiment, a thickness of the base substrate 30 is larger than 50 microns; for example, the thickness is from 50 microns to 500 microns; for another example, the thickness is from 50 microns to 150 microns. For example, the thickness of the base substrate 30 is approximately 50 microns, 75 microns, 100 microns, 125 microns, 150 microns, 200 microns, 300 microns, 400 microns, or 500 microns.

For example, still with reference to FIG. 2, the pixel electrode 21 is in direct contact with the base substrate 30; in this case, an entirety of a surface which is included by the pixel electrode 21 and which faces the base substrate 30 is in direct contact with the base substrate 30. In the embodiments of the present disclosure, the direct contact between the pixel electrode 21 and the base substrate 30 can simplify the structure and the manufacturing process of the array substrate 100; on the other hand, the direct contact between the pixel electrode 21 and the base substrate 30 can also make the via hole for the connection between the switch element 11 and the pixel electrode 21 have a smaller depth, thereby being beneficial to ensuring a good connection between the switch element 11 and the pixel electrode 21.

Figure 3A:
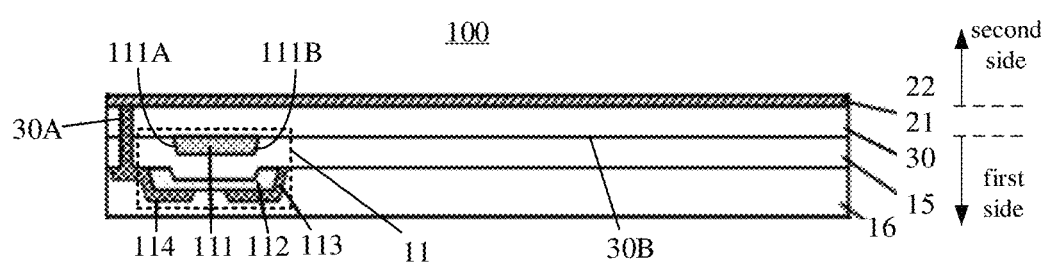
Figure 3B:
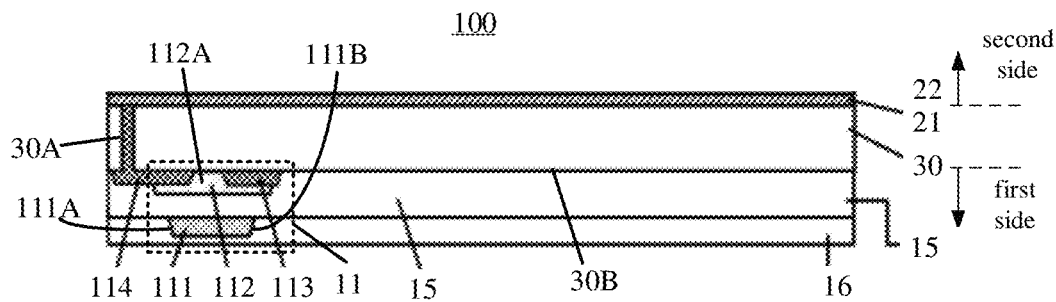

For example, the switch element 11 is a transistor or other type of switch. For example, in the case where the switch element 11 is a transistor, it may be a thin film transistor. As illustrated in FIGS. 3A and 3B, the switch element 11 includes a gate electrode 111, an active layer 112, a source electrode 113 and a drain electrode 114; the gate electrode 111 is at one side of a gate insulation layer 15, and the active layer 112, the source electrode 113 and the drain electrode 114 are at another side of the gate insulation layer 15.

For example, as illustrated in FIG. 3A and FIG. 3B, the gate electrode 111 of the switch element 11 includes side walls 111A and 111B which are respectively at opposite sides and which have opposite inclination directions; because the base substrate 30 is a substrate prepared in advance rather than a film which covers the switch element 11 and which is formed in the process of manufacturing the array substrate 100, a distance between the opposite side walls 111A and 111B of the gate electrode 111 gradually decreases in a direction from the second side of the base substrate 30 to the first side of the base substrate 30. That is, a distance between ends, close to the base substrate 30, of the opposite side walls 111A and 111B of the gate electrode 111 is larger than a distance between ends, away from the base substrate 30, of the opposite side walls 111A and 111B.

For example, as illustrated in FIG. 3A and FIG. 3B, the active layer 112 of the switch element 11 includes a channel region 112A between the source electrode 113 and the drain electrode 114, and an orthographic projection of the channel region 112A on the base substrate 30 overlaps an orthographic projection of the pixel electrode 21 on the base substrate 30. Compared with the liquid crystal display device illustrated in FIG. 1A, in some embodiments of the present disclosure, because the distance between the switch element 11 and the pixel electrode 21 is large, by allowing the orthographic projection of the channel region 112A on the base substrate 30 to overlap the orthographic projection of the pixel electrode 21 on the base substrate 30, the pixel electrode 21 can have a larger area, and thus an area of a light transmission region of the sub-pixel region is increased without increasing load and light leakage.

For example, as illustrated in FIG. 3A and FIG. 3B, each of the source electrode 113 and the drain electrode 114 of the switch element 11 may have a portion which overlaps the active layer 112 and which directly contacts the active layer 112. In other embodiments, the source electrode 113 and the drain electrode 114 may be electrically connected with the active layer 112 through via holes.

For example, one of the source electrode 113 and the drain electrode 114 of the switch element 11 may be electrically connected with the pixel electrode 21 to realize the electrical connection between the switch element 11 and the pixel electrode 21. For example, as illustrated in FIG. 3A and FIG. 3B, the drain electrode 114 of the switch element 11 is electrically connected with the pixel electrode 21. For example, the drain electrode 114 is electrically connected with the pixel electrode 21 through a portion which is included by the drain electrode 114 and which extends into the via hole 30A.

In the embodiment illustrated in FIG. 3A, the gate insulation layer 15 is provided between the source-drain electrode layer where the source electrode 113 and the drain electrode 114 of the switch element 11 are located and the base substrate 30, and the via hole for the connection of the switch element 11 and the pixel electrode 21 passes through the gate insulation layer 15 and the base substrate 30.

In the embodiment illustrated in FIG. 3B, no gate insulation layer is provided between the source-drain electrode layer where the source electrode 113 and the drain electrode 114 of the switch element 11 are located and the base substrate 30. In this case, for example, the via hole for the connection between the switch element 11 and the pixel electrode 21 only passes through the base substrate 30; for example, the drain electrode 114 electrically connected with the pixel electrode 21 includes a portion which is at a position outside the via hole 30A and which is in direct contact with the base substrate 30. In other embodiments, for example, the source electrode 113 electrically connected with the pixel electrode 21 includes a portion which is at a position outside the via hole 30A and which is in direct contact with the base substrate 30. In embodiments of the present disclosure, the direct contact between the source-drain electrode layer and the base substrate 30 is beneficial to further simplifying the structure and the manufacturing process of the array substrate 100 and reducing the depth of the via hole for connection between the switch element 11 and the pixel electrode 21.

For example, as illustrated in FIG. 3A and FIG. 3B, the array substrate 100 further includes an insulation layer 16 at a side, away from the base substrate 30, of the switch element 11. For example, a side, away from the switch element 11, of the insulation layer 16 has a flat surface (i.e., the insulation layer 16 is a planarization insulation layer); the flat surface is favorable for attaching a polarizer thereon and improving display uniformity of a display device adopting the array substrate.

It should be noted that the base substrate 30 and the pixel electrode 21 in FIG. 3A and FIG. 3B can be arranged with reference to the embodiment illustrated in FIG. 2, which is not repeated here.

Figure 4:
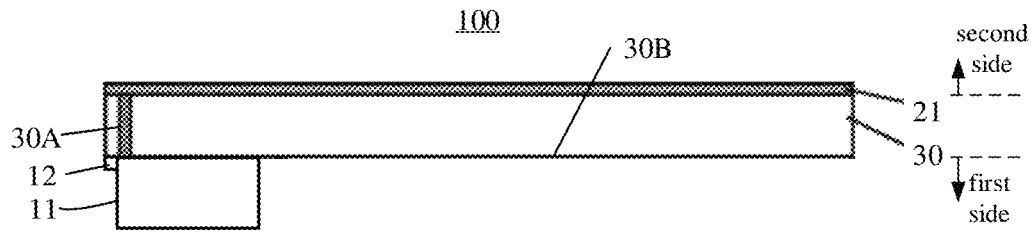

For example, as illustrated in FIG. 4, the array substrate 100 provided by at least one embodiment of the present disclosure includes a signal line 12 electrically connected with the switch element 11, in addition to including the switch element 11 and the pixel electrode 21 which are on the base substrate 30. For example, the signal line 12 and the switch element 11 are at a same side of the base substrate 30, so that a distance between the signal line 12 and the pixel electrode 21 is relatively large, thus there is a small electric field or even no electric field between the signal line 12 and the pixel electrode 21 under a condition that the signal line 12 and the pixel electrode 21 are electrified, thereby reducing or eliminating adverse effects on liquid crystal molecules at a position where the signal line is located, being beneficial to further reducing the light leakage during the dark state display and improving the display contrast ratio.

For example, as illustrated in FIG. 4, an orthographic projection of the signal line 12 on the base substrate 30 overlaps the orthographic projection of the pixel electrode 21 on the base substrate 30, which is advantageous to increase the area of the pixel electrode 21 to increase the area of the light transmission region of the sub-pixel region, thereby increasing the aperture ratio.

For example, in some embodiments of the present disclosure, the array substrate 100 includes a variety of signal lines located on the base substrate 30. For example, the array substrate 100 includes a plurality of gate lines sequentially arranged and a plurality of data lines sequentially arranged, and an extension direction of the gate line is different from an extension direction of the data line, so that the gate lines and the data lines cross each other to form a plurality of sub-pixel regions arranged in an array.

Figure 5A:
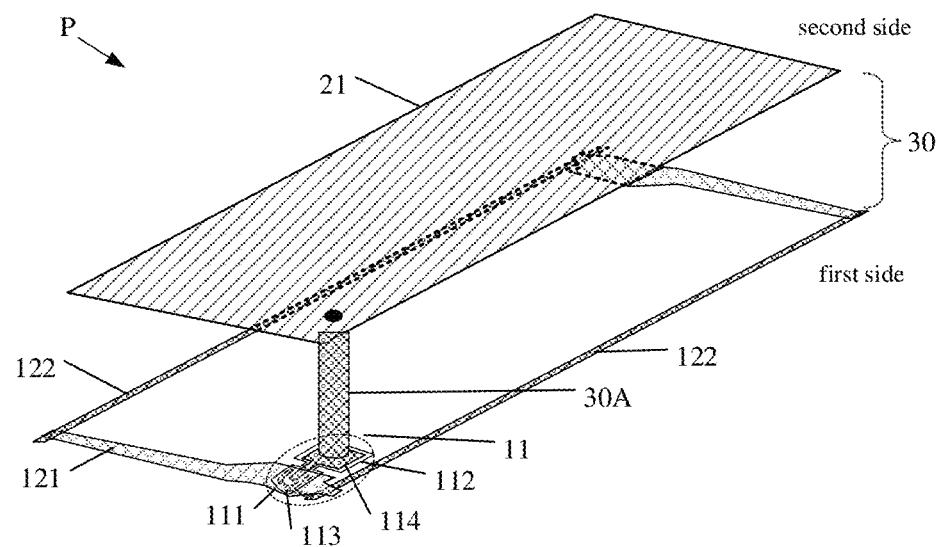
FIG. 5A is a perspective view of the sub-pixel region of the array substrate provided by some embodiments of the present disclosure.
Figure 5B:
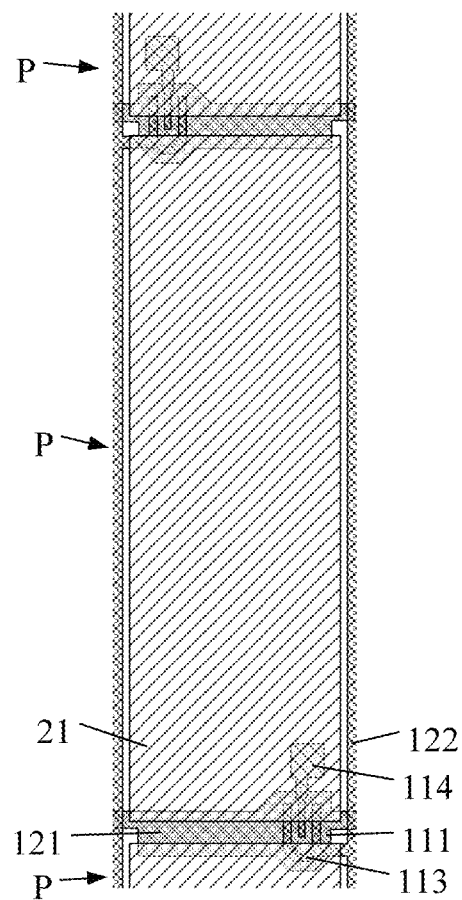
FIG. 5B and FIG. 5C are schematic plan views of the sub-pixel region of the array substrate provided by some embodiments of the disclosure.
Figure 5C:
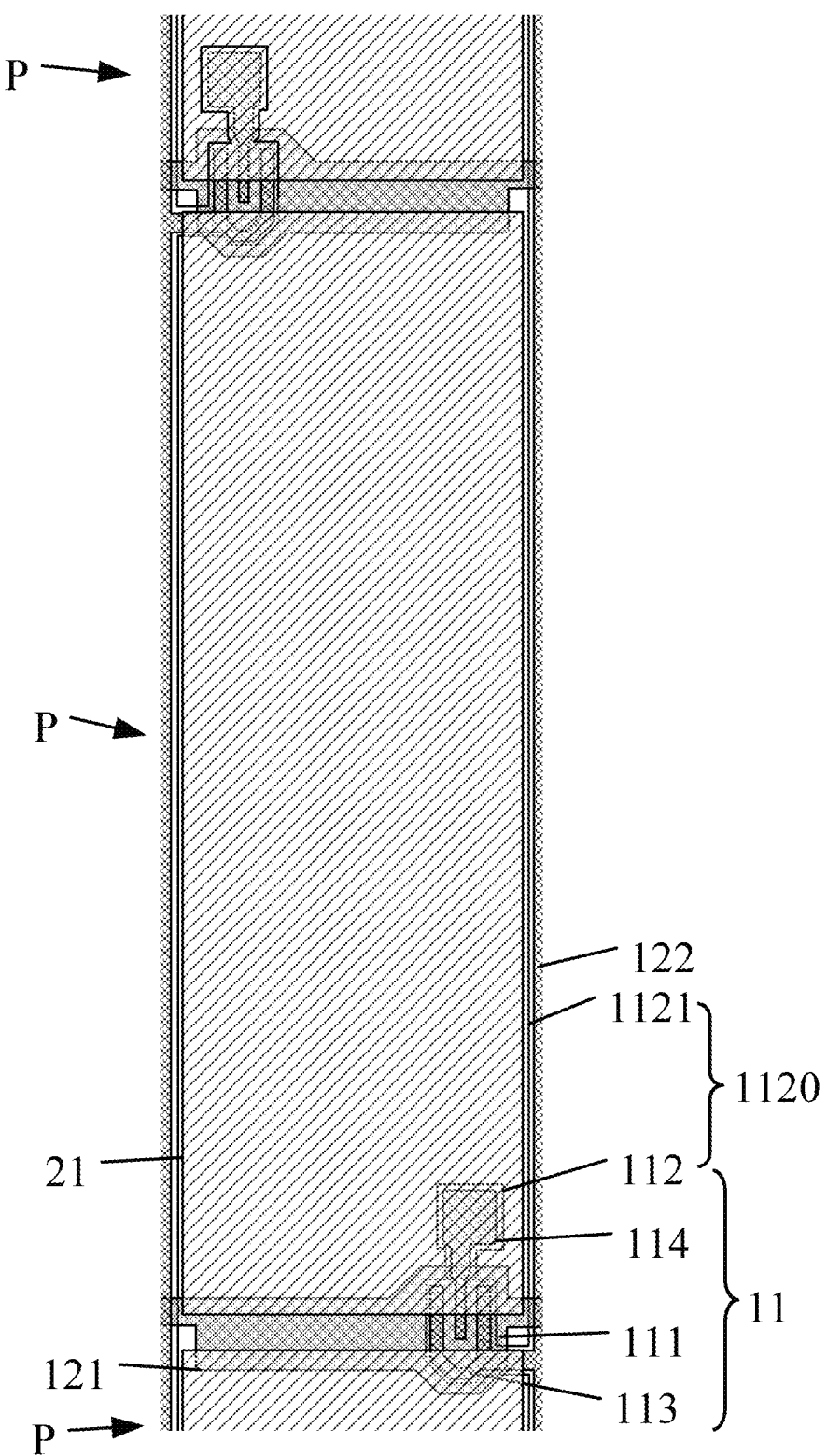
Figure 6A:
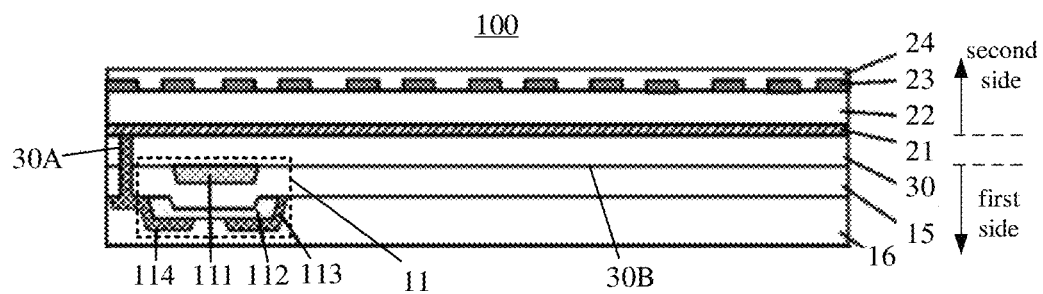
FIG. 6A to FIG. 7B are schematic cross-sectional views of the array substrate provided by some embodiments of the disclosure.
Figure 6B:
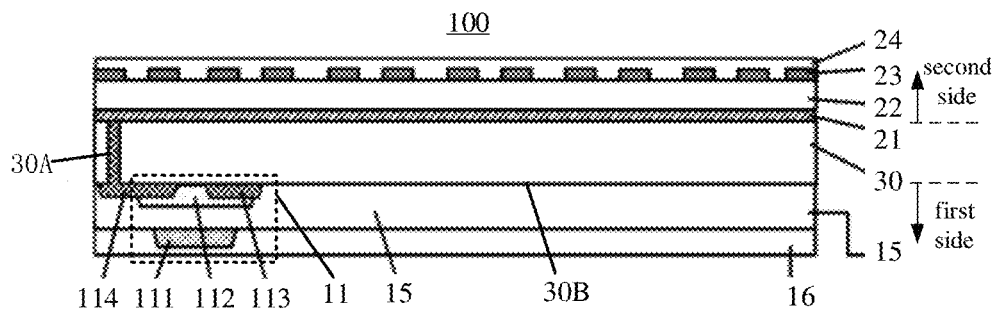

FIG. 5A is a perspective view of the sub-pixel region P of the array substrate provided by some embodiments of the present disclosure; FIG. 5B and FIG. 5C are schematic plan views of the sub-pixel region of the array substrate provided by some embodiments of the disclosure.

As illustrated in FIG. 5A to FIG. 5C, a region formed by adjacent gate lines 121 and adjacent data lines 122 which cross each other is the sub-pixel region P. For example, one pixel electrode 21 and one switch element 11 are disposed in the sub-pixel region P, one data line 122 is electrically connected (e.g., directly electrically connected) with the source electrode 113 of the switch element 11, and a portion of one gate line 121 serves as the gate electrode 111 of the switch element 11 to realize the electrical connection of the gate line 121 with the switch element 11. For example, in some embodiments, as illustrated in FIG. 5C, a semiconductor layer 1120 where the active layer 112 is located further includes a linear portion 1121 overlapping the data line 122, in addition to including the active layer 112.

For example, the signal line 12 is the gate line 121 electrically connected with the gate electrode 111 of the switch element 11. For example, the gate line 121 and the gate electrode 111 are located in a same layer (a gate electrode layer). Or, the above-mentioned signal line 12 is the data line 122 electrically connected with the source electrode 113 of the switch element 11. For example, the data line 122, the source electrode 113 and the drain electrode 114 are located in a same layer (the source-drain electrode layer).

For example, as illustrated in FIG. 5A, the gate line 121, the data line 122 and the switch element 11 are all located at the first side of the base substrate 30, the pixel electrode 21 is located at the second side of the base substrate 30, and the drain electrode 114 of the switch element 11 extends into the via hole 30A of the base substrate 30 to electrically connect the pixel electrode 21. For example, as illustrated in FIG. 5B and FIG. 5C, a width of the gate line 121 is larger than a width of the data line 122, and an orthographic projection of the gate line 121 on the base substrate (not illustrated in the figure) overlaps the orthographic projection of the pixel electrode 21 on the base substrate. In other embodiments, the width of the data line 122 may be larger than the width of the gate line 121, and the orthographic projection of the data line 122 on the base substrate overlaps the orthographic projection of the pixel electrode 21 on the base substrate. In some embodiments of the present disclosure, by arranging a wider signal line (e.g., the gate line 121 illustrated in FIG. 5B and FIG. 5C) and the switch element 11 to be at the same side of the base substrate 30 and by allowing the orthographic projection of the signal line on the base substrate 30 to overlap the orthographic projection of the pixel electrode 21 on the base substrate 30, it is possible to effectively increase the area of the pixel electrode 21 to increase the area of the light transmission region of the sub-pixel region without increasing the load.

For example, the same signal line overlaps pixel electrodes 21 which are respectively located at two sides of this signal line and which are arranged in a width direction of this signal line. For example, as illustrated in FIG. 5B and FIG. 5C, the same gate line 121 overlaps the pixel electrodes 21 which are respectively located at two sides of this gate line and which are arranged in the width direction of this gate line. In other embodiments, the same data line 122 may overlap the pixel electrodes 21 which are respectively located at two sides of this data line and which are arranged in a width direction of this data line.

It should be noted that the base substrate 30, the pixel electrode 21 and the switch element 11 in FIG. 4 to FIG. 5C can be arranged with reference to the embodiments illustrated in FIG. 2 to FIG. 3B, which is not repeated here.

In the embodiments illustrated in FIGS. 4 to 5C, the switch element 11 and the signal line 12 (e.g., the gate line 121 or the data line 122) are separated from the pixel electrode 21 by the base substrate 30, which can effectively reduce or eliminate light leakage, so that the black matrix can have a smaller size to increase the aperture ratio.

The array substrate 100 provided by some embodiments of the present disclosure may be an array substrate that includes both the pixel electrode 21 and the common electrode, or may be an array substrate that does not include the common electrode. In the case where the array substrate 100 includes the common electrode, the common electrode and the pixel electrode are located at a same side of the base substrate, and the common electrode and the pixel electrode 21 may be disposed in a same layer or in different layers.

The array substrate 100 provided by the embodiments illustrated in FIG. 6A to 7B includes the common electrode disposed in a different layer different from a layer where the pixel electrode 21 is located. For example, as illustrated in FIG. 6A to FIG. 7B, the array substrate 100 includes a passivation insulation layer 22 and a common electrode 23, the passivation insulation layer 22 is located at the second side of the base substrate 30 and covers the pixel electrode 21, and the common electrode 23 is located at a side, away from the pixel electrode 21, of the passivation insulation layer 22, so that the common electrode 23 and the pixel electrode 21 are located at the same side of the base substrate 30, and the layer where the pixel electrode 21 is located is between the layer where the common electrode 23 is located and the base substrate 30, which is beneficial to making the depth of the via hole for connection between the pixel electrode 21 and the switch element 11 smaller. In other embodiments, the common electrode 23 may be between the pixel electrode 21 and the base substrate 30.

Figure 8:
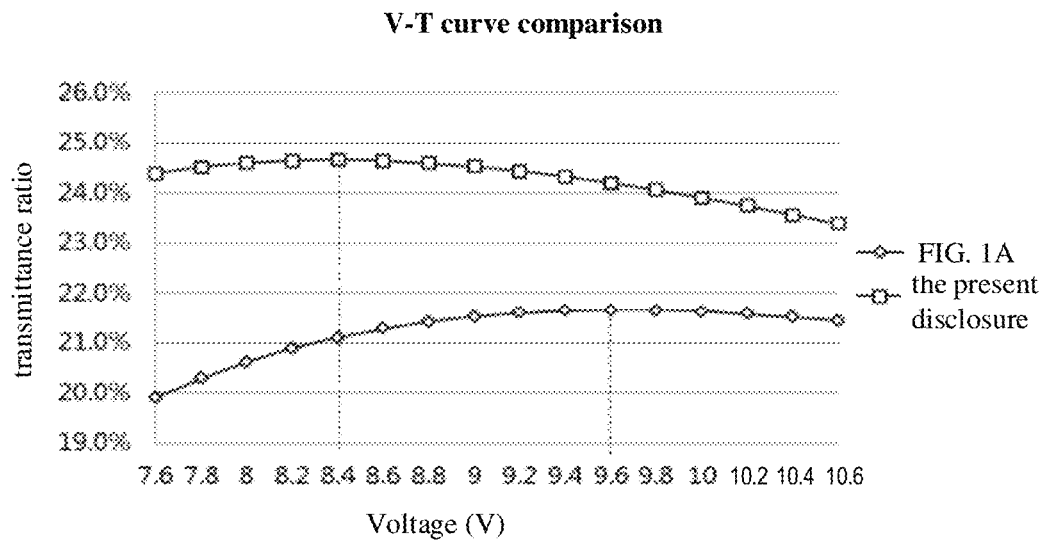
FIG. 8 is a graph comparing a VT curve of the array substrate provided by some embodiments of the disclosure in a case where the array substrate is used in a liquid crystal display device with a VT curve of the liquid crystal display device illustrated in FIG. 1A.

Compared with the case in which the gate insulation layer 3B is provided between the pixel electrode 3D and the common electrode 3A illustrated in FIG. 1A, in the array substrate 100 provided by some embodiments of the present disclosure, the distance between the pixel electrode 21 and the common electrode is less because of the absence of the gate insulation layer 15 (see FIGS. 3A and 3B), so that a driving voltage of an electronic device including the array substrate 100 is smaller. For example, as illustrated in FIG. 8, the driving voltage is 9.6V when the liquid crystal display device illustrated in FIG. 1A has the maximum transmittance, and the driving voltage is 8.4V when the liquid crystal display device adopting the array substrate provided by some embodiments of the present disclosure has the maximum transmittance, and thus it can be seen that the array substrate provided by some embodiments of the present disclosure reduces the working voltage by 1.2V when the transmittance is maximum, thereby reducing a power consumption of the display operation under same conditions.

For example, as illustrated in FIG. 6A to FIG. 7B, the passivation insulation layer 22 is in direct contact with the pixel electrode 21 and the common electrode 23 to further simplify the structure and the manufacturing process of the array substrate 100.

For example, as illustrated in FIG. 6A to FIG. 7B, the array substrate 100 further includes an alignment layer 24 located at the second side of the base substrate 30. For example, the alignment layer 24 directly covers the common electrode 23 to further simplify the structure and the manufacturing process of the array substrate 100.

For example, an alignment direction of the alignment layer 24 is along an extension direction of the signal line 12. In this case, the array substrate provided by the embodiments of the present disclosure may adopt a multi-domain mode to reduce color shift of the display device including the array substrate. For example, in a case where the signal line 12 is the gate line 121 and the alignment direction of the alignment layer 24 is along the extension direction of the gate line 121, the width of the gate line 121 is larger than the width of the data line 122, as illustrated in FIG. 5A to FIG. 5C, to reduce light leakage near the gate line 121; or, in a case where the signal line 12 is the data line 122 and the alignment direction of the alignment layer 24 is along the extension direction of the data line 122, the width of the data line 122 is larger than the width of the gate line 121 to reduce light leakage near the data line 122.

Figure 7A:
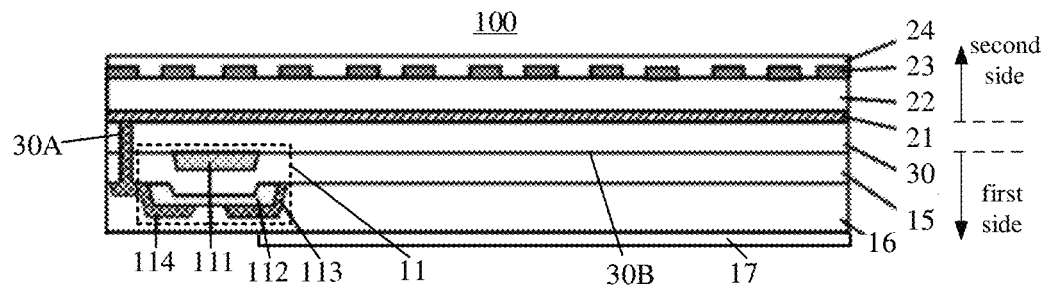
Figure 7B:
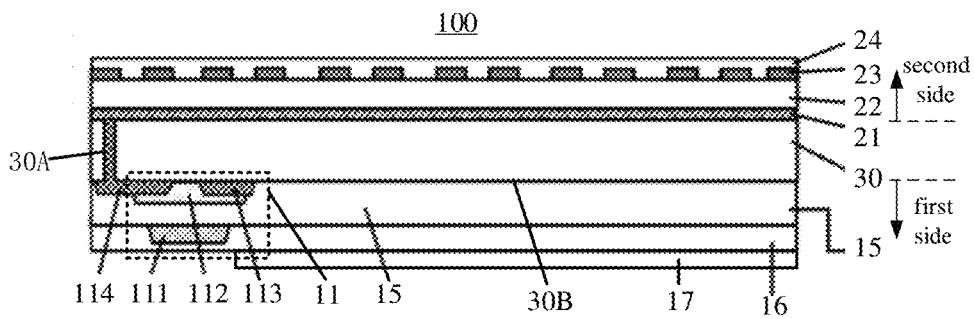

The array substrate 100 provided by the embodiments illustrated in FIG. 7A and FIG. 7B adopts a COA (color filter on array) design, that is, the array substrate 100 includes a color filter layer. For example, as illustrated in FIG. 7A and FIG. 7B, the array substrate 100 includes a color filter layer 17 that is on the base substrate 30, and the color filter layer 17 and the switch element 11 are at a same side of the base substrate 30. Because the color filter layer 17 and the switch element 11 are at the first side of the base substrate 30, there are no switch elements 11 and the color filter layer 17 in a liquid crystal cell formed by connecting the array substrate 100 and the opposite substrate by a sealant, which can reduce defects caused by particles generated in the liquid crystal cell in the manufacturing process and ameliorate a phenomenon of display nonuniformity (Mura) caused by mismatch between layers.

For example, the color filter layer 17 includes a plurality of red filter patterns, a plurality of green filter patterns and a plurality of blue filter patterns. In order to reduce the mismatch between the filter patterns, for example, the insulation layer 16 is between the base substrate 30 and the color filter layer 17, and the insulation layer 16 is in direct contact with the color filter layer 17.

It should be noted that the base substrate 30, the pixel electrode 21 and the switch element 11 in the embodiments illustrated in FIG. 6A to FIG. 7B can be arranged with reference to the relevant descriptions in the embodiments illustrated in FIG. 2 to FIG. 3B, which is not repeated here.

Figure 9:
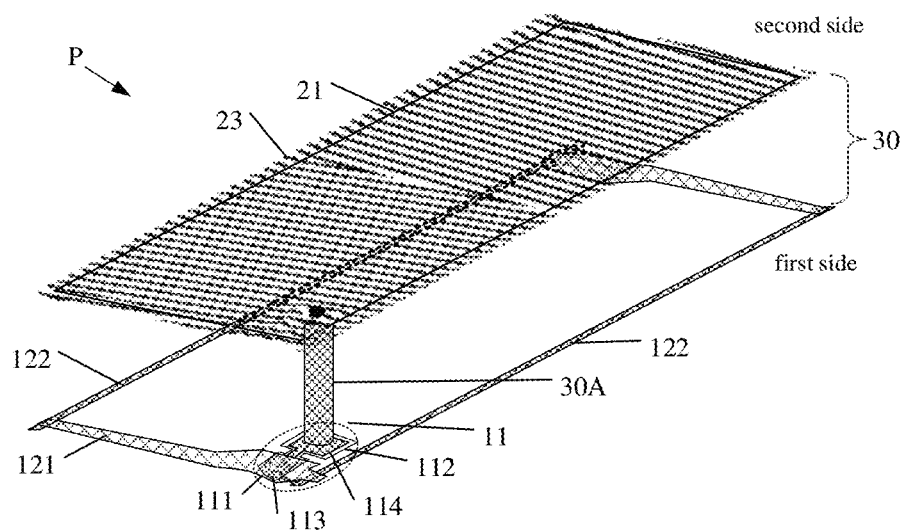
FIG. 9 is a perspective view of the sub-pixel region in a case where the array substrate includes a common electrode, provided by some embodiments of the disclosure.

FIG. 9 is another perspective view of the sub-pixel region P of the array substrate 100 provided by some embodiments of the disclosure, and the sub-pixel region P illustrated in FIG. 9 further includes the common electrode 23 based on the sub-pixel region P illustrated in FIG. 5A. It can be seen from FIG. 5A and FIG. 9, in the sub-pixel region P, the pixel electrode 21 is in a lower layer and has a continuous plate-shaped structure (hereinafter referred to as a plate-shaped electrode), and the common electrode 23 is in an upper layer and is a slit electrode having a plurality of slits (hereinafter referred to as a slit electrode).

In the liquid crystal display device illustrated in FIG. 1A, the common electrode 3A is in a lower layer and has a continuous plate-shaped structure (hereinafter referred to as a plate-shaped electrode), and the pixel electrode 3D is in an upper layer and is a slit electrode having a plurality of slits (hereinafter referred to as a slit electrode).

Compared with the liquid crystal display device illustrated in FIG. 1A, in some embodiments of the present disclosure, when both the gate line 121 and the data line 122 are at the side, where the switch element 11 is provided, of the base substrate 30, space released by the switch element 11, the gate line 121 and the data line 122 can be used to increase an area of the plate-shaped electrode and an area of the slit electrode; moreover, because the switch element 11, the gate line 121 and the data line 122 are all separated from the plate-shaped electrode and the slit electrode by the thick base substrate 30 (e.g., the thickness of the base substrate 30 is larger than 50 microns), an increase in load cannot be caused in a case where the switch element 11/gate line 121/data line 122 overlaps the plate-shaped electrode/slit electrode.

Figure 10A:
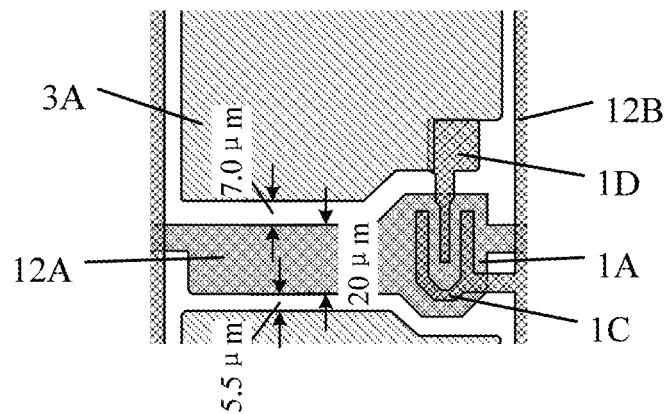
FIG. 10A is a schematic diagram showing a dimensional relationship between a plate-shaped electrode and a gate line in the liquid crystal display device illustrated in FIG. 1A.
Figure 10B:
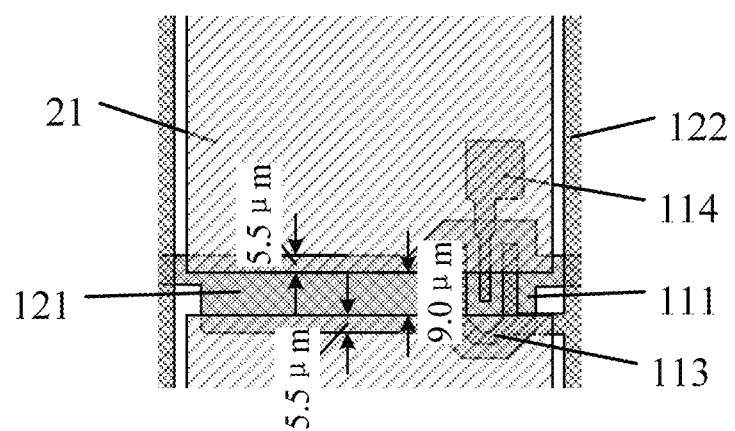
FIG. 10B is a schematic diagram of a dimensional relationship between the plate electrode and the gate line in some embodiments of the disclosure.

FIG. 10A is a schematic diagram showing a dimensional relationship between the plate-shaped electrode (the common electrode 3A) and the gate line 12A in the liquid crystal display device illustrated in FIG. 1A; FIG. 10B is a schematic diagram of a dimensional relationship between the plate-shaped electrode (the pixel electrode 21) and the gate line 121 in some embodiments of the disclosure.

Comparing FIG. 10A with FIG. 10B, it can be seen that a distance between adjacent plate-shaped electrodes in FIG. 10A is 7.0+20+5.5=32.5 microns, and a distance between adjacent plate-shaped electrodes in FIG. 10B is 9.0 microns, and thus a length of the plate-shaped electrodes in the embodiments of the present disclosure is increased by 32.5−9.0=23.5 microns, which greatly increases the area of the plate-shaped electrodes. In other embodiments of the present disclosure, the distance between adjacent plate electrodes may be less than 9.0 microns or larger than 9.0 microns as long as electrical signals of the adjacent plate-shaped electrodes do not interfere with each other.

Figure 11:
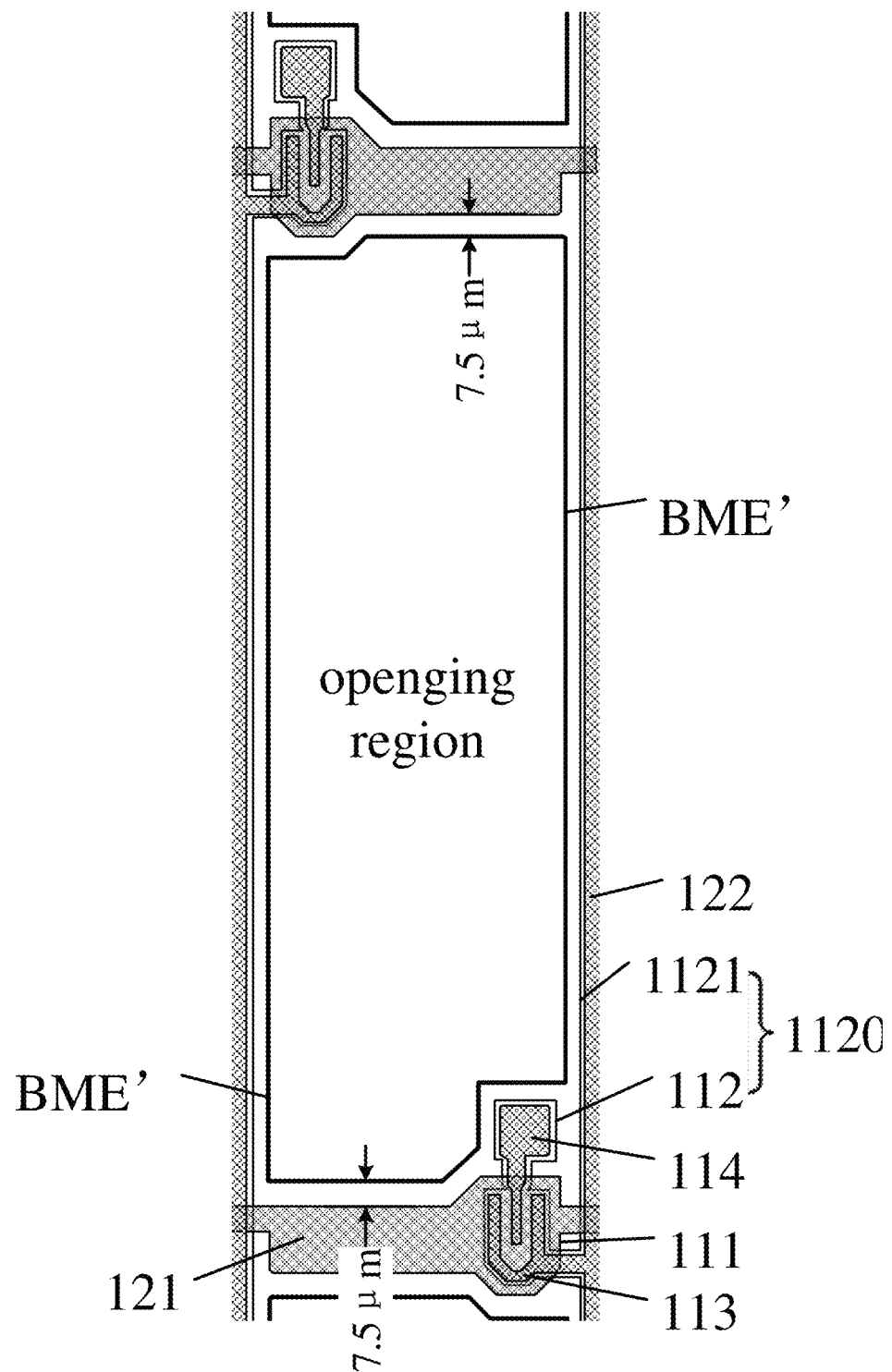
FIG. 11 is a schematic diagram of the opening region of the sub-pixel region in the array substrate provided by some embodiments of the present disclosure.

In some embodiments of the present disclosure, the aperture ratio of the sub-pixel region can be effectively increased by reducing or eliminating light leakage and increasing the area of the plate-shaped electrode. For example, as illustrated in FIG. 11, a region outside the opening region is a region where the black matrix is located; in a case where the array substrate of some embodiments of the present disclosure is applied to a liquid crystal display device, a distance between an edge BME' of the region where the black matrix is located and the gate line 121 is 7.5 microns. Compared with the distance between the edge BME of the black matrix and the gate line 12A illustrated in FIG. 1D, a length of the opening region is significantly increased, so that a proportion of the opening region (i.e., the aperture ratio) is significantly increased, for example, the aperture ratio can be increased by 9.4%.

Figure 12A:
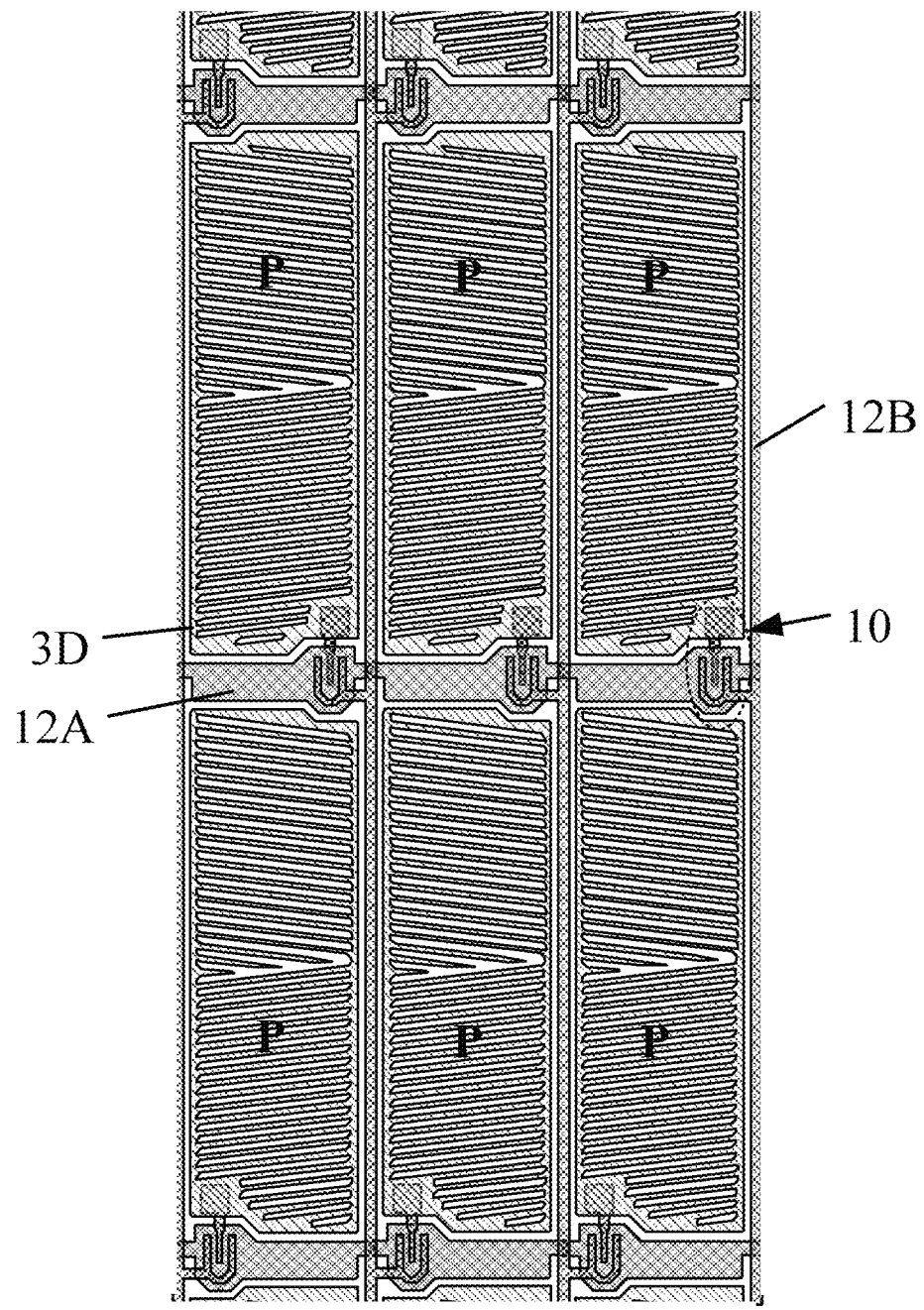
FIG. 12A shows a pattern of slit electrodes in the liquid crystal display device illustrated in FIG. 1A.
Figure 12B:
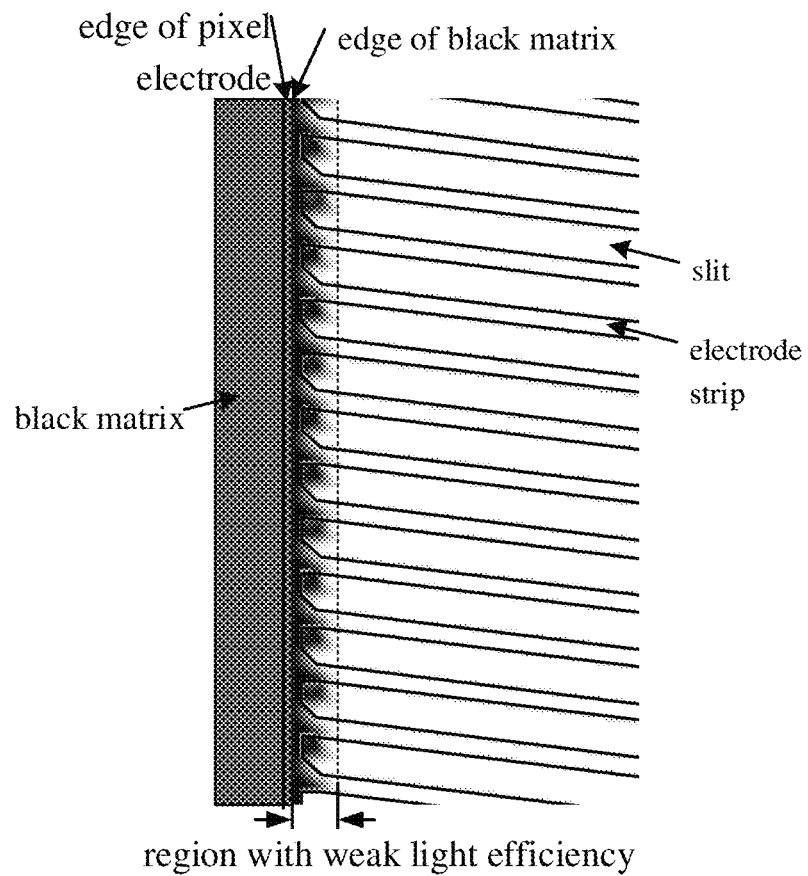
FIG. 12B is a schematic distribution diagram of a region with a weak light efficiency in the sub-pixel region of the liquid crystal display device illustrated in FIG. 1A.

FIG. 12A shows a pattern of slit electrodes (the pixel electrodes 3D) in the liquid crystal display device illustrated in FIG. 1A; FIG. 12B is a distribution diagram of a region with weak light efficiency in the sub-pixel region of the liquid crystal display device illustrated in FIG. 1A.

As illustrated in FIG. 12A, the slit electrode (the pixel electrode 3D) is a slit electrode having a plurality of slits, each sub-pixel region P is provided with one slit electrode, and the slit electrodes in adjacent sub-pixel regions P are spaced apart from each other, which results in the region with weak light efficiency at ends of electrode strips of the slit electrode. For example, as illustrated in FIG. 12B, the electrode strips of the slit electrode extend to a vicinity of the black matrix (e.g., the black matrix at this position extends in the extension direction of the data line) and there is the region with weak light efficiency near the black matrix.

Figure 13A:
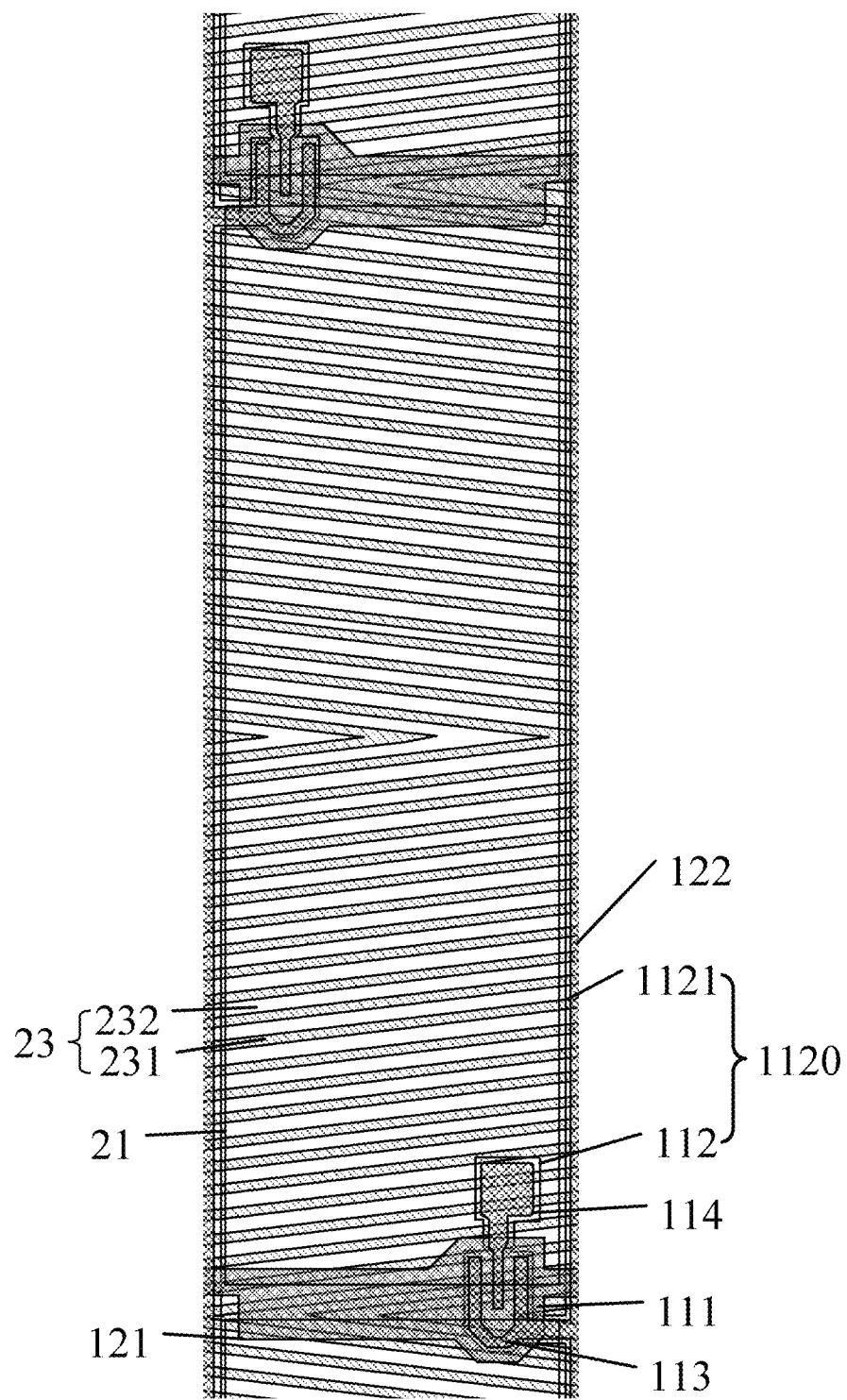
FIG. 13A shows a pattern of a slit electrode in one sub-pixel region in the array substrate provided by some embodiments of the present disclosure.
Figure 13B:
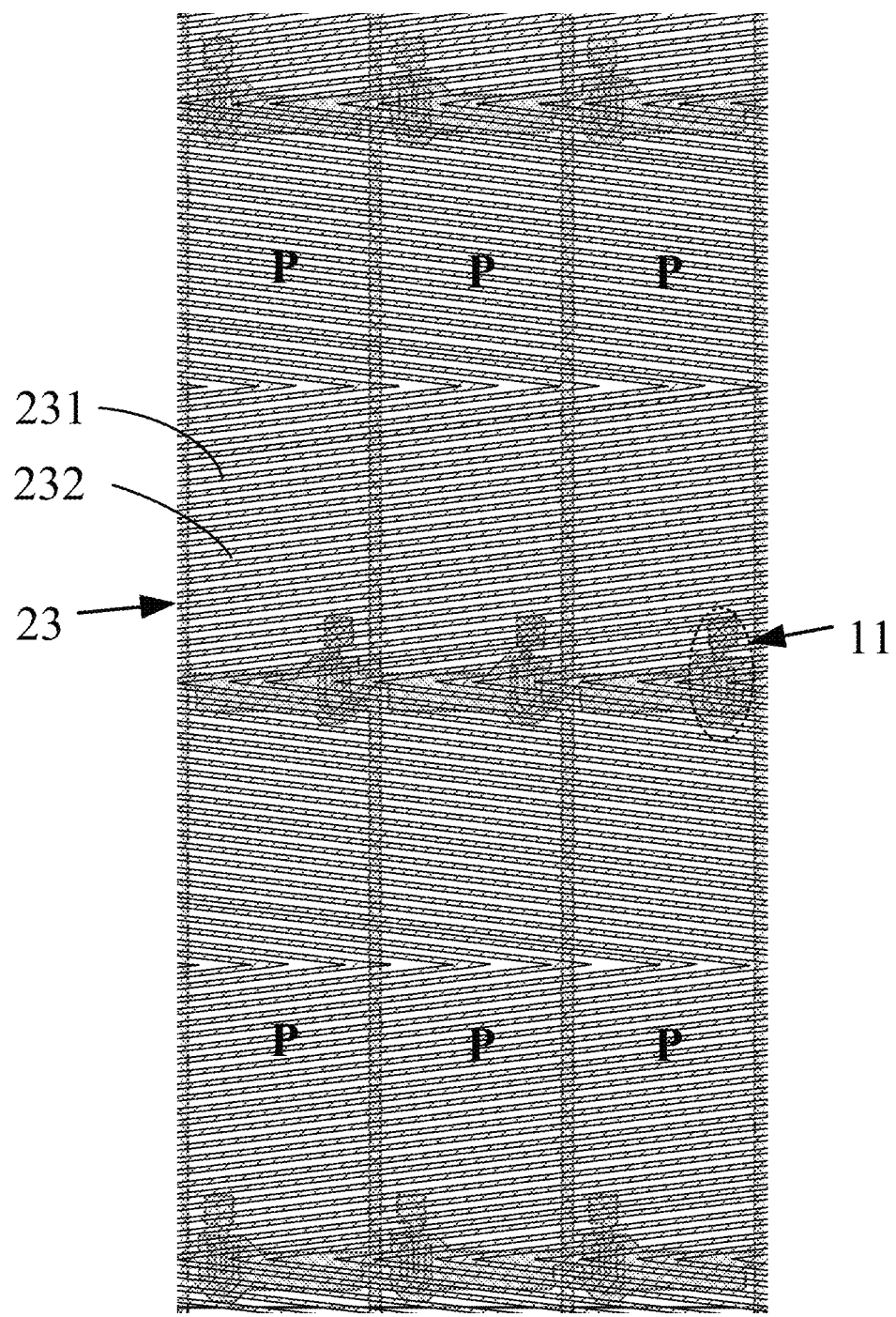
FIG. 13B shows a pattern of the slit electrode in a plurality of sub-pixel regions in the array substrate provided by some embodiments of the present disclosure.
Figure 13C:
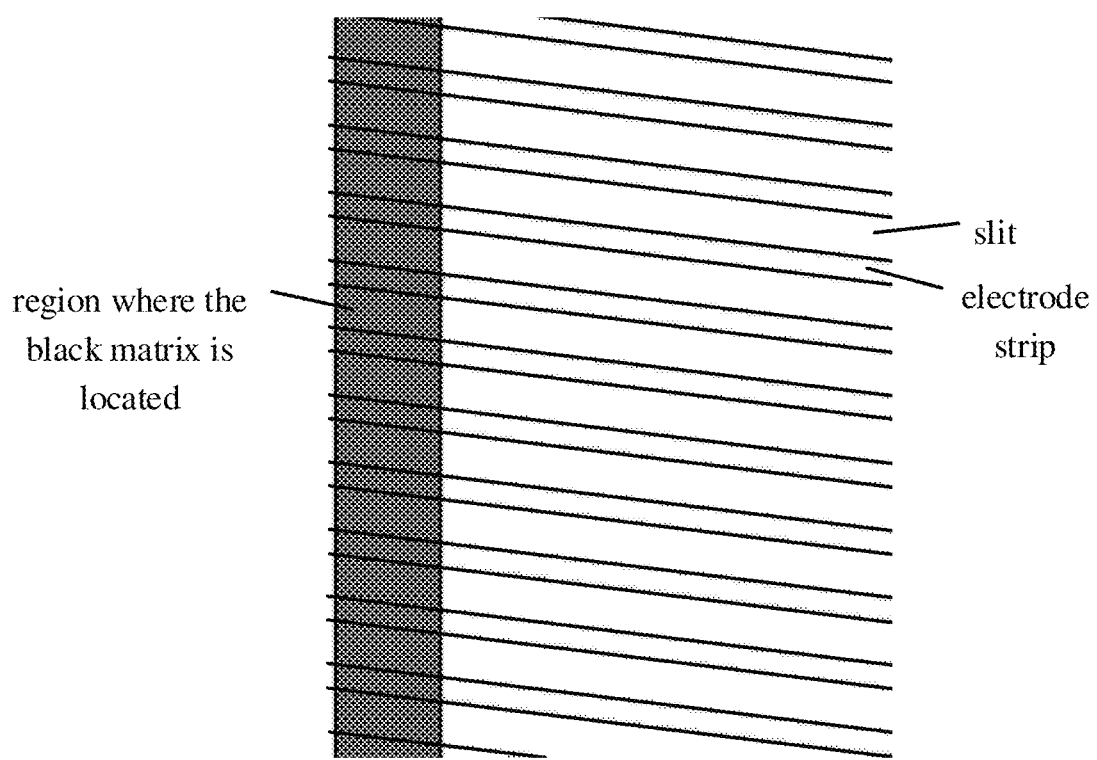
FIG. 13C is a schematic distribution diagram of the region with the weak light efficiency in the sub-pixel region of the array substrate provided by some embodiments of the disclosure.

FIG. 13A shows a pattern of the slit electrode (the common electrode 23) in one sub-pixel region in the array substrate provided by some embodiments of the present disclosure; FIG. 13B shows a pattern of the slit electrode (the common electrode 23) in a plurality of sub-pixel regions in the array substrate provided by some embodiments of the present disclosure; FIG. 13C is a schematic diagram of distribution of a region with weak light efficiency in sub-pixel region of the array substrate provided by some embodiments of the disclosure.

As illustrated in FIG. 13A, the slit electrode (the common electrode 23) includes a plurality of electrode strips (with reference to common electrode strips 231) arranged in sequence and slits 232 arranged alternately with the electrode strips, each of the electrode strips 231 is in a plurality of sub-pixel regions P (it should be noted that the slit electrode may include not only a longer electrode strip 231 but also a shorter electrode strip, as illustrated in FIG. 13A and FIG. 13B). Therefore, in some embodiments of the present disclosure, the slit electrode is continuous at a position where the signal line is located, thereby improving the light efficiency at the position where the signal line is located. For example, as illustrated in FIG. 13C, the electrode strips of the slit electrode do not have a region with weak light efficiency near the region where the black matrix is located (e.g., the black matrix at this position extends along the extension direction of the data line). For example, the light efficiency of the array substrate provided by some embodiments of the present disclosure can be improved by 4.4%.

In summary, because of the improvement of the aperture ratio and the light efficiency, a transmittance ratio is greatly improved. For example, the transmittance ratio can be increased by 13.8%, with the aperture ratio increased by 9.4% and the light efficiency increased by 4.4%. For example, it can be seen from FIG. 8, the maximum transmittance ratio of the liquid crystal display device illustrated in FIG. 1A is about 21.8%, and the maximum transmittance ratio of the liquid crystal display device provided by some embodiments of the present disclosure is about 24.8%. Thus, some embodiments of the present disclosure improve the transmittance ratio by (24.8%−21.8%)/21.8%≈13.8%.

Figure 14:
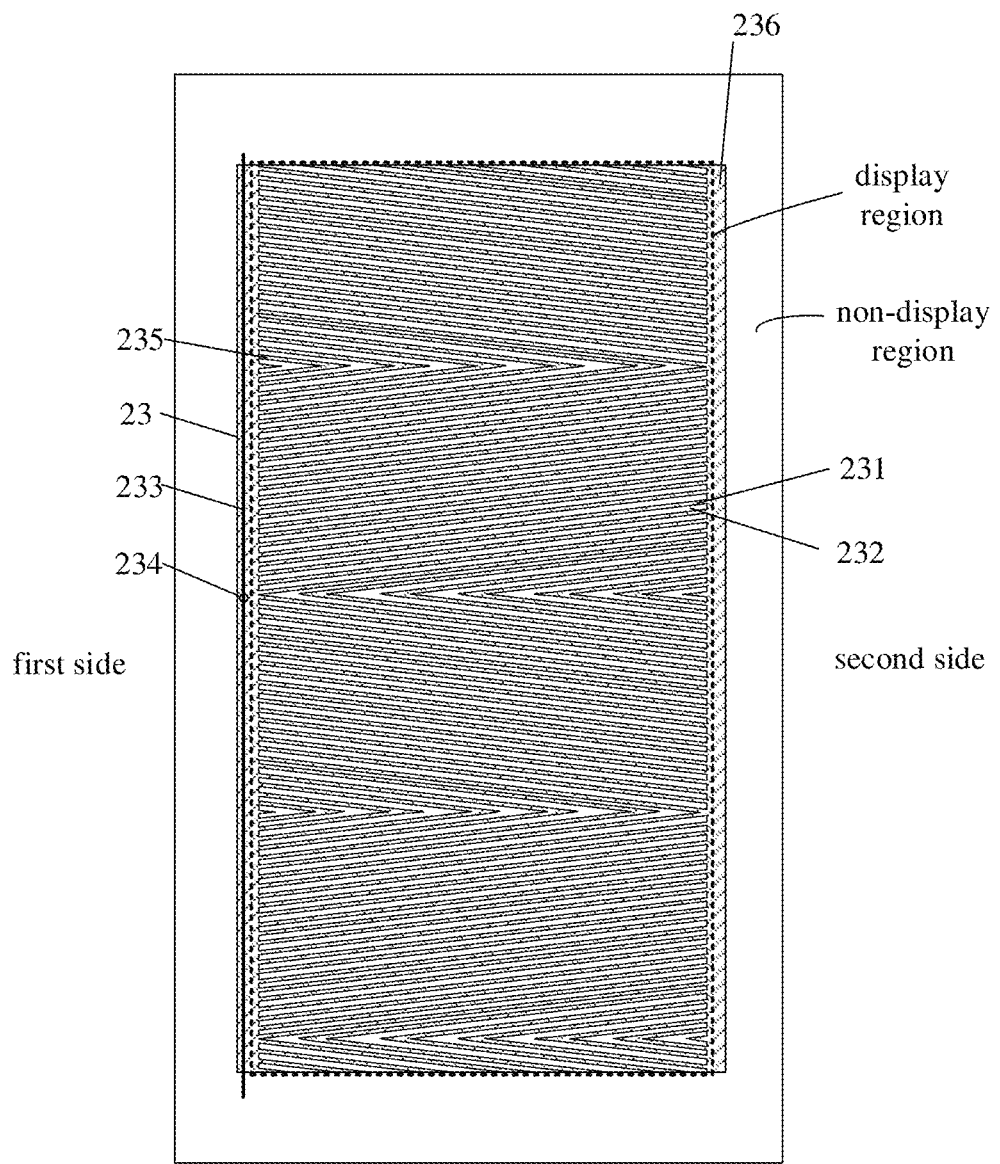
FIG. 14 is a schematic plan view of the array substrate provided by some embodiments of the disclosure.

For example, as illustrated in FIG. 14, the array substrate includes a display region (a region surrounded by a dashed frame) and a non-display region outside the display region. The common electrode 23 includes a longer common electrode strip 231 extending from a first boundary between the display region and the non-display region to a second boundary between the display region and the non-display region, and the first boundary is opposite to the second boundary. That is, the common electrode strip 231 is of a one-piece structure extending continuously between the first boundary and the second boundary. It should be noted that sub-pixel regions arranged in an array are provided in the display region, and the display region includes the opening regions of the sub-pixel regions and a non-opening region outside the opening regions.

For example, as illustrated in FIG. 14, the non-display region is provided with the common electrode signal line 233 and the common electrode via hole 234 which passes through the plate body of the base substrate 30, and the common electrode signal line 233 is electrically connected with the common electrode 23 through the common electrode via hole 234. In some embodiments of the present disclosure, because the common electrode strip 231 is continuous in the display region, in at least one embodiment, the common electrode signal line 233 may be provided in only the non-display region to apply a common voltage to the common electrode 23 without providing the common electrode signal line 233 in the display region, thus simplifying the structure of the array substrate. In addition, because the common electrode signal line 233 is electrically connected with the common electrode 23 through the common electrode via hole 234 passing through the base substrate 30, a distance between the common electrode signal line 233 and the common electrode 23 is relatively large, so that the load is small.

For example, in at least one embodiment, as illustrated in FIG. 14, the common electrode 23 further includes common electrode strips 235 shorter than the common electrode strips 231 and includes a connection portion 236. These shorter common electrode strips 235 and the longer common electrode strips 231 have ends which are at a same side of the display region and which are all directly electrically connected with the connection portion 236, i.e., a one-piece structure is formed by the longer common electrode strips 231, the shorter common electrode strips 235 and the connection portion 236. For example, the common electrode 23 includes one connection portion 236 or includes a plurality of connection portions 236 (FIG. 14 takes a case where the common electrode 23 includes two connection portions 236 as an example). For example, a portion which is included by the connection portion 236 and which is located in the non-display region is electrically connected with the common electrode signal line 233 through the common electrode via hole 234.

For example, the common electrode signal line 233 and the switch element 11 are at a same side of the base substrate 30, which is advantageous for reducing the load between the common electrode signal line 233 and the pixel electrode 21. For example, the common electrode signal line 233 and the gate electrode 111 of the switch element 11 are in a same layer, or the common electrode signal line 233 and the source electrode 113 and the drain electrode 114 of the switch element 11 are in a same layer, so as to simplify the process of manufacturing the array substrate.

Figure 15:
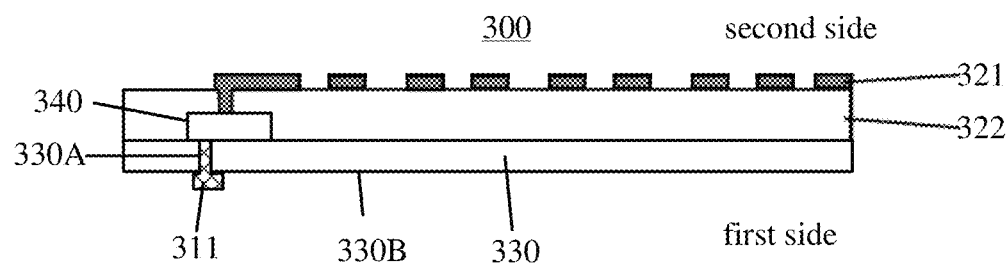
FIG. 15 is a schematic cross-sectional view of another array substrate provided by some embodiments of the disclosure.

As illustrated in FIG. 15, some embodiments of the present disclosure further provide an array substrate 300 including a base substrate 330, a signal line 311, a switch element 340 and a pixel electrode 321; the base substrate 330 has a first side, a second side opposite to the first side, and a via hole 330A passing through a plate body of the base substrate 330; the signal line 311 is at the first side of the base substrate 330; the switch element 340 is at the second side of the base substrate 330 and is electrically connected with the signal line 311 through the via hole 330A; the pixel electrode 321 is at the second side of the base substrate 330 and is electrically connected with the switch element 340.

For example, as illustrated in FIG. 15, the array substrate 300 further includes an insulation layer 322, the insulation layer 322 is between the switch element 311 and the pixel electrode 321 and has a via hole, and pixel electrode 321 is electrically connected with the switch element 311 through this via hole.

In some embodiments of the present disclosure, the base substrate 330 separates the signal line 311 from the pixel electrode 321, and a distance between the signal line 311 and the pixel electrode 321 is large, so there is a small electric field or even no electric field between the signal line 311 and the pixel electrode 321, so that the embodiments of the present disclosure can reduce or eliminate a phenomenon of light leakage during dark state display.

For example, the array substrate 300 is an array substrate for a transmissive liquid crystal display device, in this case, the base substrate 330 is a transparent substrate and the pixel electrode 321 is a transparent electrode. In other embodiments, the array substrate 300 may also be an array substrate for other types of electronic devices. For example, the array substrate 300 is the array substrate including the pixel electrode 321 and the common electrode, or may be an array substrate that does not include the common electrode.

For example, the base substrate 330 is a glass substrate, a plastic substrate, or a quartz substrate. For example, a material of the base substrate 330 is photosensitive glass, and the photosensitive glass is, for example, glass obtained by making $SiO_2$—$Li_2O$—$Al_2O_3$-based glass include a small amount of photosensitive metals Au, Ag and Cu and a small amount of photosensitizer $CeO_2$. Embodiments of that present disclosure include, but are not limited to this.

It should be noted that in some embodiments of the present disclosure, the base substrate 330 is a basic raw material for manufacturing the array substrate 300, that is, the base substrate 330 is a plate-shaped structure prepared in advance rather than a film formed on other plate-shaped structure in a process of manufacturing the array substrate 300. In addition, the via hole 330A provided in the base substrate 330 may be formed in the process of manufacturing the array substrate 300, or may be formed before the process of manufacturing the array substrate 300.

Because the base substrate 330 is a substrate prepared in advance rather than a film which covers the signal line 311 and which is formed in the process of manufacturing the array substrate 100, and therefore, for example, in at least one embodiment, outside a position where the via hole 330A is located, a surface 330B which is provided with the signal line 311 and which is included by the base substrate 330 is flat at a position where the signal line 311 is located.

For example, in at least one embodiment, a thickness of the base substrate 330 is larger than 50 microns; for example, the thickness of the base substrate 330 is from 50 microns to 500 microns; for another example, the thickness of the base substrate 330 is from 50 microns to 150 microns. For example, a thickness of the base substrate 330 is approximately 50 microns, 75 microns, 100 microns, 125 microns, 150 microns, 200 microns, 300 microns, 400 microns, or 500 microns.

For example, the switch element 340 is a transistor or other type of switch. For example, in the case where the switch element 340 is a transistor, it may be a thin film transistor; for example, the switch element 340 includes a gate electrode, an active layer, a source electrode and a drain electrode.

For example, the signal line 311 is a gate line which is electrically connected with the gate electrode of the switch element 340, for example; or, for example, the signal line 311 is a data line which is electrically connected with the source electrode of the switch element 340.

At least one embodiment of the present disclosure provides an electronic device including the array substrate 100 or the array substrate 300 provided by any one of the above embodiments.

Figure 16:
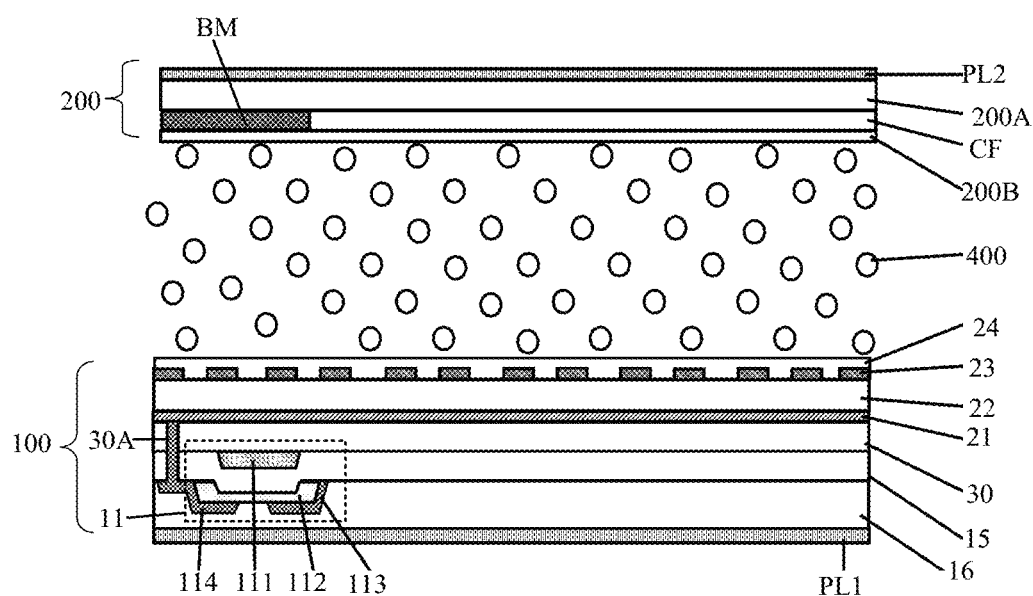
FIG. 16 is a schematic cross-sectional view of an electronic device in a case where the electronic device provided by some embodiments of the disclosure is a liquid crystal display device.

For example, as illustrated in FIG. 16, the electronic device provided by at least one embodiment of the present disclosure further includes an opposite substrate 200 which is opposite to the array substrate 100, and the second side of the array substrate 100 is a side of the array substrate 100 facing the opposite substrate 200.

For example, the opposite substrate 200 is a color filter substrate which includes, for example, a base substrate 200A and a black matrix BM, a color filter layer CF and a planarization layer 200B which are located on the base substrate 200A.

For example, the electronic device provided by some embodiments of the present disclosure is a display device, and the display device may be any product or component with a display function such as a liquid crystal panel, a mobile phone, a tablet computer, a television, a display, a notebook computer, a digital photo frame, a navigator, etc. The electronic devices provided by some embodiments of the present disclosure may also be a non-display electronic device such as a liquid crystal grating.

For example, the electronic device is a liquid crystal display device and further includes a liquid crystal layer 400 between the array substrate 100 and the opposite substrate 200. For example, the liquid crystal display device further includes a polarizer PL1 at the array substrate 100 and a polarizer PL2 at the opposite substrate 200.

Some embodiments of the present disclosure also provide a manufacturing method of an array substrate, taking the array substrate 100 illustrated in any one of the above embodiments and the corresponding figures as an example, the method includes the following steps S1 to S3.

Step S1: performing a hole-producing process on the base substrate 30 so that the base substrate 30 is formed with the via hole 30A passing through the plate body of the base substrate 30;

For example, the via hole 30A is made at a reserved position of the base substrate 30 by chemical etching, mechanical drilling or femtosecond laser technology. Embodiments of the present disclosure include, but are not limited to, these hole-producing methods.

For example, the base substrate 30 is a glass substrate, a plastic substrate, or a quartz substrate.

For example, a material of the base substrate 30 is photosensitive glass, and the photosensitive glass is, for example, glass obtained by making $SiO_2$—$Li_2O$—$Al_2O_3$-based glass include a small amount of photosensitive metals Au, Ag and Cu and a small amount of photosensitizer $CeO_2$. In this case, forming the via hole 30A includes, for example: irradiating a portion which is to be formed with the via hole and which is included by a glass substrate made of the photosensitive glass by using ultraviolet light (e.g., the ultraviolet light has a wavelength of 310 nm), and generating metal atoms by performing an oxidation reaction (redox action) on the portion; then, heating the portion which is to be formed with the via hole (for example, a heating temperature is from 500 degrees Celsius to 600 degrees Celsius), thereby agglomerating the metal atoms to form colloid; then, using the colloid as crystal nucleus, performing the growing of $Li_2O \cdot SiO_2$ (lithium silicate) crystal; then, placing the glass substrate into a HF (hydrogen fluoride) solution. Because lithium silicate is easily dissolved in the HF solution, the via hole 30A can be obtained because of difference between a dissolution rate of glass and a dissolution rate of lithium silicate.

Step S2: forming the switch element 11 at the first side of the base substrate 30.

For example, forming the switch element 11 as illustrated in FIG. 3A includes: forming a gate metal layer including the gate electrode 111 on the base substrate 30; then, forming the gate insulation layer 15 covering the gate electrode 111 so that the gate insulation layer 15 has a via hole at a position corresponding to the via hole 30A; then, forming the semiconductor layer including the active layer 112 on the gate insulation layer 15; then, forming the source-drain electrode layer including the source electrode 113 and the drain electrode 114 so that the drain electrode 114 fills the via hole in the gate insulation layer 15 and the via hole 30A in the base substrate 30 to electrically connect the pixel electrode 21.

For example, forming the switch element 11 as illustrated in FIG. 3B includes: forming a source-drain electrode layer including the source electrode 113 and the drain electrode 114 on the base substrate 30 so that the drain electrode 114 fills the via hole 30A in the base substrate 30 to electrically connect the pixel electrode 21; then, forming the semiconductor layer including the active layer 112; then, forming the gate insulation layer 15 covering the semiconductor layer; then, forming the gate electrode layer including the gate electrode 111.

For example, for the switch element 11 illustrated in FIG. 3A and FIG. 3B, the formed source-drain electrode layer further includes the data lines, and the formed gate electrode layer further includes the gate lines so as to reduce the process of manufacturing the array substrate.

Step S3: forming the pixel electrode 21 at the second side, opposite to the first side, of the base substrate 30 so that the pixel electrode 21 is electrically connected with the switch element 11 through the via hole 30A.

For example, forming the pixel electrode 21 includes: forming a pixel electrode material layer on the base substrate 30, and then patterning the pixel electrode material layer to obtain a plurality of plate-shaped pixel electrodes 21 spaced apart from each other.

It should be noted that the embodiments of the present disclosure do not limit the order of the above-mentioned steps of performing the hole-producing process on the base substrate 30, forming the pixel electrode 21 and forming the switch element 11. The order of these steps can be selected according to actual needs. For example, the base substrate 30 may be subjected to the hole-producing process first to obtain the via hole 30A; then, the switch element 11 is formed so that the drain electrode 114 of the switch element 11 extends into the via hole 30A of the base substrate 30, so that a small resistance occurs at the position of the via hole 30A; after that, the pixel electrode 21 is formed on the other side of the base substrate 30.

For example, in the case where the array substrate 100 further includes the common electrode, the manufacturing method provided by at least one embodiment of the present disclosure further includes: forming the common electrode. The structure of the common electrode can be arranged with reference to any one of the above embodiments about the array substrate 100.

In the array substrate, the manufacturing method thereof and the electronic device provided by the embodiments of the present disclosure, the arrangement modes of components with the same reference numerals can be mutually referenced.

What have been described above are only specific implementations of the present disclosure, the protection scope of the present disclosure is not limited thereto. The protection scope of the present disclosure should be based on the protection scope of the claims.

What is claimed is:

1. An array substrate, comprising:
    a base substrate having a via hole passing through the base substrate in a thickness direction of the base substrate;
    a switch element at a first side of the base substrate; and
    a pixel electrode at a second side of the base substrate, wherein the first side and the second side are opposite to each other in the thickness direction of the base substrate, and the pixel electrode is electrically connected with the switch element through the via hole.

2. The array substrate according to claim 1, wherein outside a position where the via hole is located, a surface which is comprised by the base substrate and which is provided with the switch element is flat at a position where the switch element is located.

3. The array substrate according to claim 1, wherein a thickness of the base substrate is larger than 50 microns.

4. The array substrate according to claim 1, wherein the base substrate comprises a glass substrate, a plastic substrate or a quartz substrate.

5. The array substrate according to claim 1, wherein the switch element comprises a gate electrode, and the gate electrode comprises side walls which are respectively at opposite sides of the gate electrode and which have opposite inclination directions; and a distance between the side walls gradually decreases in a direction from the second side to the first side.

6. The array substrate according to claim 1, wherein the switch element comprises an active layer comprising a channel region, and an orthographic projection of the channel region on the base substrate overlaps an orthographic projection of the pixel electrode on the base substrate.

7. The array substrate according to claim 1, wherein the switch element comprises a source electrode and a drain electrode, one of the source electrode and the drain electrode is electrically connected with the pixel electrode and comprises a portion outside the via hole, and the portion is in direct contact with the base substrate.

8. The array substrate according to claim 1, wherein the pixel electrode is in direct contact with the base substrate.

9. The array substrate according to claim 1, further comprising:
    a signal line which is at the first side of the base substrate and which is electrically connected with the switch element; and
    an alignment layer which is at the second side of the base substrate and which has an alignment direction which is along an extension direction of the signal line.

10. The array substrate according to claim 9, wherein an orthographic projection of the signal line on the base substrate overlaps an orthographic projection of the pixel electrode on the base substrate.

11. The array substrate according to claim 9, further comprising:
    a passivation insulation layer which is at the second side of the base substrate and which directly covers the pixel electrode; and
    a common electrode which is at a side, away from the pixel electrode, of the passivation insulation layer and which is in direct contact with the passivation insulation layer,
    wherein the alignment layer directly covers the common electrode.

12. The array substrate according to claim 1, further comprising:
    a common electrode, wherein the common electrode is at the second side of the base substrate; the common electrode and the pixel electrode are in different layers.

13. The array substrate according to claim 12, wherein a layer where the pixel electrode is located is between a layer where the common electrode is located and the base substrate.

14. The array substrate according to claim 13, wherein the array substrate comprises sub-pixel regions arranged in an array; the common electrode comprises a plurality of common electrode strips arranged in sequence, and each common electrode strip is in a plurality of sub-pixel regions among the sub-pixel regions.

15. The array substrate according to claim 14, wherein the array substrate comprises a display region and a non-display region outside the display region,
    the common electrode strip extends from a first boundary between the display region and the non-display region to a second boundary between the display region and the non-display region, and the first boundary is opposite to the second boundary.

16. The array substrate according to claim 15, wherein a common electrode signal line and a common electrode via hole which passes through the base substrate in the thickness direction of the base substrate are in the non-display region, and the common electrode signal line is electrically connected with the common electrode through the common electrode via hole.

17. The array substrate according to claim 1, further comprising:
    a color filter layer on the base substrate, wherein the color filter layer and the switch element are at a same side of the base substrate.

18. An electronic device, comprising the array substrate according to claim 1.

19. A manufacturing method of an array substrate, comprising:
- performing a hole-producing process on a base substrate so that the base substrate is formed with a via hole passing through a plate body of the base substrate;
- forming a switch element at a first side of the base substrate; and
- forming a pixel electrode at a second side, opposite to the first side, of the base substrate, wherein the pixel electrode is electrically connected with the switch element through the via hole.

20. An array substrate, comprising:
- a base substrate having a first side, a second side opposite to the first side, and a via hole passing through a plate body of the base substrate;
- a signal line at the first side of the base substrate;
- a switch element which is at the second side of the base substrate and which is electrically connected with the signal line through the via hole; and
- a pixel electrode which is at the second side of the base substrate and which is electrically connected with the switch element.

* * * * *